(12) United States Patent
Griffiths et al.

(10) Patent No.: US 12,663,457 B2
(45) Date of Patent: Jun. 23, 2026

(54) FAULT-MANAGED POWER VIA BLACK-CHANNEL SAFETY PROTOCOL

(71) Applicant: Rockwell Automation Technologies, Inc., Mayfield Heights, OH (US)

(72) Inventors: Scott Griffiths, Port Washington, WI (US); David D. Brandt, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 152 days.

(21) Appl. No.: 18/545,855

(22) Filed: Dec. 19, 2023

(65) Prior Publication Data

US 2025/0199049 A1     Jun. 19, 2025

(51) Int. Cl.
*G01R 31/08* (2020.01)
*H04L 12/10* (2006.01)

(52) U.S. Cl.
CPC ............ *G01R 31/086* (2013.01); *H04L 12/10* (2013.01)

(58) Field of Classification Search
None
See application file for complete search history.

(56) References Cited

U.S. PATENT DOCUMENTS

| | | |
|---|---|---|
| 8,068,937 B2 | 11/2011 | Eaves |
| 8,781,637 B2 | 7/2014 | Eaves |
| 9,184,795 B2 | 11/2015 | Eaves |
| 9,419,436 B2 | 8/2016 | Eaves et al. |
| 9,853,689 B2 | 12/2017 | Eaves |
| 9,893,521 B2 | 2/2018 | Lowe et al. |
| 10,468,879 B2 | 11/2019 | Eaves |
| 10,541,543 B2 | 1/2020 | Eaves |
| 10,714,930 B1 | 7/2020 | Weiss et al. |

(Continued)

FOREIGN PATENT DOCUMENTS

| | | |
|---|---|---|
| EP | 2929607 B1 | 9/2020 |
| WO | 2018178990 A1 | 10/2018 |

(Continued)

OTHER PUBLICATIONS

Notice of Allowance issued by the USPTO in U.S. Appl. No. 18/545,947 on Sep. 3, 2025, 8 pages.

*Primary Examiner* — Farhana A Hoque

(57) ABSTRACT

The present technology relates to fault-managed power, and particularly, to generating fault-managed power in an industrial automation environment using single-pair Ethernet cabling. A fault-managed power system may include transmitter circuitry and receiver circuitry coupled together via a transmission link formed using single-pair Ethernet cable. The transmitter circuitry can generate a fault-managed power based on power from a power source and transmit an unpulsed signal, including the fault-managed power, to the receiver circuitry via the transmission link. The receiver circuitry can identify an expected power consumption of one or more loads coupled to the receiver circuitry and provide an indication of the expected power consumption to the transmitter circuitry. The transmitter circuitry can detect a fault based on a comparison between the transmitted fault-managed power and the power consumption and terminate transmission of the fault-managed power in response to detecting the fault.

20 Claims, 5 Drawing Sheets

100

(56)                    References Cited

U.S. PATENT DOCUMENTS

| | | | |
|---|---|---|---|
| 2017/0229886 A1 | 8/2017 | Eaves | |
| 2018/0313886 A1 | 11/2018 | Mlyniec et al. | |
| 2020/0295559 A1 | 9/2020 | Eaves et al. | |
| 2021/0063447 A1 | 3/2021 | Eaves | |
| 2021/0263545 A1* | 8/2021 | Goergen | G06F 21/44 |
| 2022/0032804 A1 | 2/2022 | Goergen et al. | |
| 2023/0299661 A1 | 9/2023 | Lumanog | |
| 2023/0378938 A1 | 11/2023 | Bolouri-Saransar | |
| 2024/0168533 A1 | 5/2024 | Arduini | |
| 2024/0421593 A1 | 12/2024 | Shea | |
| 2025/0096603 A1 | 3/2025 | Castro | |

FOREIGN PATENT DOCUMENTS

| | | | |
|---|---|---|---|
| WO | 2020227045 A1 | 11/2020 | |
| WO | 2022015536 A1 | 1/2022 | |
| WO | 2022066272 A1 | 3/2022 | |
| WO | 2022081778 A1 | 4/2022 | |

* cited by examiner

100

Power Source
105

FMP Transmitter
110

Circuitry
111

(Single-pair Ethernet (SPE))
112

FMP Receiver
115

Circuitry
116

120
(Industrial
Devices)

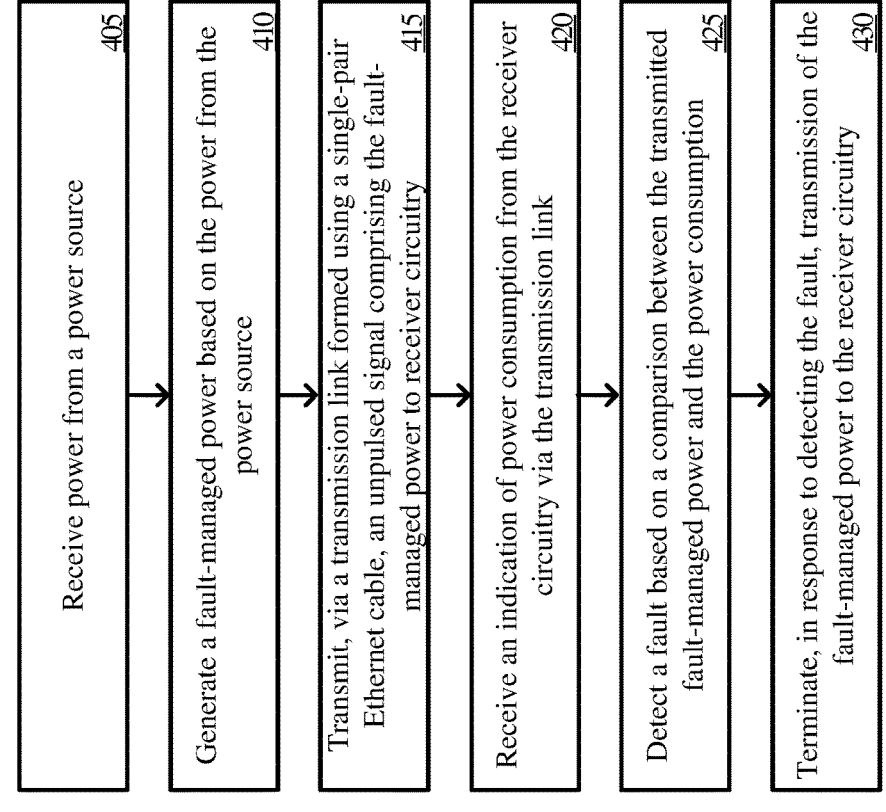

Receive power from a power source                                    405

Generate a fault-managed power based on the power from the
power source                                                        410

Transmit, via a transmission link formed using a single-pair
Ethernet cable, an unpulsed signal comprising the fault-
managed power to receiver circuitry                                 415

Receive an indication of power consumption from the receiver
circuitry via the transmission link                                420

Detect a fault based on a comparison between the transmitted
fault-managed power and the power consumption                       425

Terminate, in response to detecting the fault, transmission of the
fault-managed power to the receiver circuitry                       430

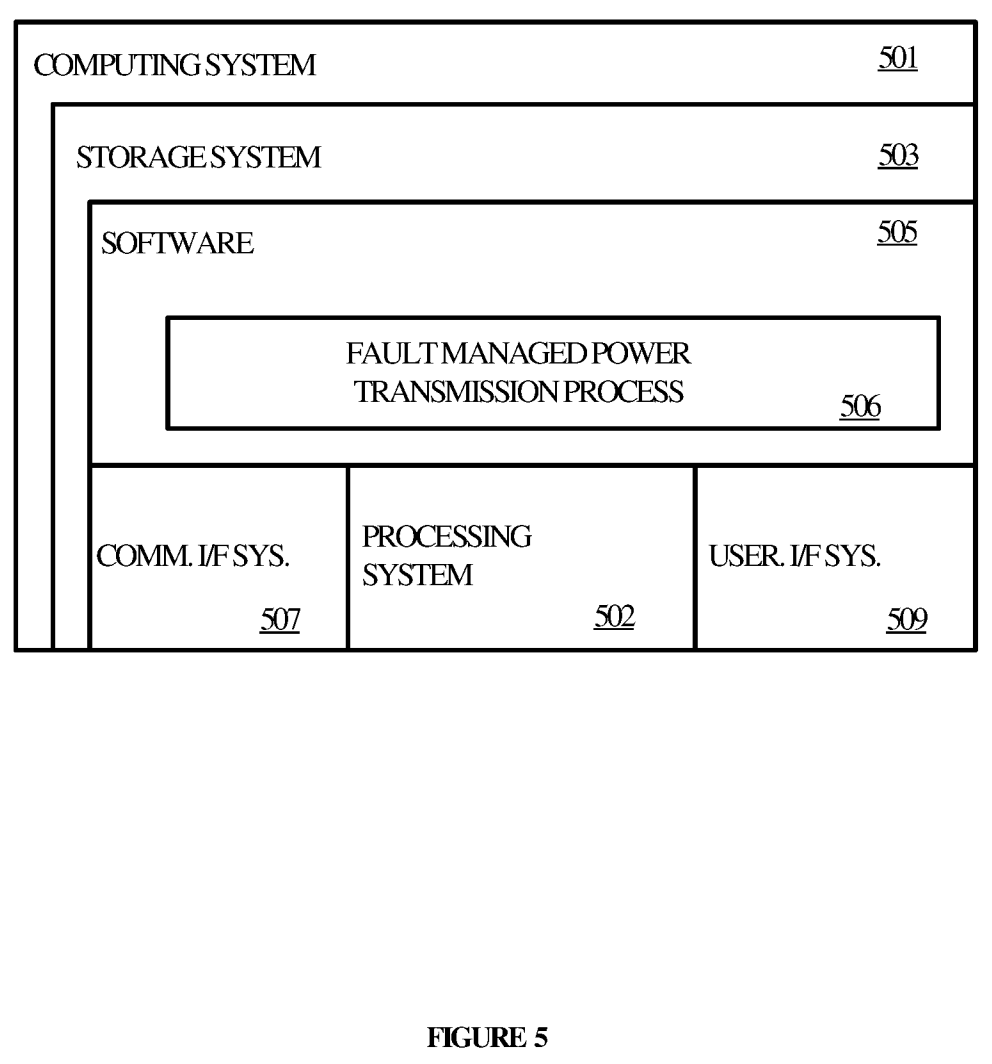

COMPUTING SYSTEM          501

STORAGE SYSTEM          503

SOFTWARE          505

FAULT MANAGED POWER TRANSMISSION PROCESS          506

COMM. I/F SYS.          507

PROCESSING SYSTEM          502

USER. I/F SYS.          509

FIGURE 5

FAULT-MANAGED POWER VIA BLACK-CHANNEL SAFETY PROTOCOL

RELATED APPLICATIONS

This application is related to U.S. patent application Ser. No. 18/545,947, titled "DC MOTOR DRIVEN BY CLASS 4 FAULT-MANAGED POWER INTEGRATED INTO A LOW-VOLTAGE DRIVE", filed Dec. 19, 2023, and U.S. patent application Ser. No. 18/389,593, titled "FAULT-MANAGED POWER FOR DISTRIBUTED DRIVES", filed Dec. 19, 2023, which are both hereby incorporated by reference in their entirety.

TECHNICAL FIELD

Various embodiments of the present technology relate to fault-managed power, and particularly, to generating fault-managed power in an industrial automation environment.

BACKGROUND

Fault-managed power is a class of commercial power under the National Electric Code (NEC) in the United States that includes the use of a transmitter and a receiver to transfer power over low-voltage cable and monitor such power for faults that may cause harm to people, structures, or devices. Fault-managed power falls under Class 4 power and therefore can only include a transmission of 450 V or less. Further requirements under the NEC related to Class 4 power require a fault-managed power transmitter to detect various types of faults, including short-circuits, line-to-line faults, line-to-ground faults, overcurrent, malfunction in monitoring components, and any other condition that may cause fire or shock.

Various fault-managed power solutions exist today to convert and transfer grid power over low-voltage cabling. For example, one fault-managed power solution provides pulsed fault-managed power to a receiver. When the transmission of power is "on," the receiver receives the fault-managed power. When the transmission of power is "off," the transmitter does not send power, but rather, the receiver communicates signals back to the transmitter related to power consumption of the fault-managed power. In another example, a transmitter sends fault-managed power over a transmission line to a receiver. The receiver, however, does not communicate back to the transmitter using the same transmission line. Rather, the receiver and transmitter communicate with each other using a mesh network.

SUMMARY

Systems, devices, and methods are provided herein for generating fault-managed power transmittable from a transmitter to a receiver as an unpulsed signal using single-pair Ethernet cabling. An industrial or commercial environment may include various industrial automation devices, such as variable-speed drives, motors, and the like, that perform industrial automation processes. Such devices require power to perform industrial or automation operations, however, traditional power delivered to these devices may be limited with respect to safety and voltage. Rather, fault-managed power, or class 4 power, can provide higher voltages to industrial devices using cost-effective and longer, flexible cables with built-in safety mechanisms to detect line-to-line and line-to-ground faults, among other types of faults. The fault-managed power can be monitored by both the transmitter and the receiver to determine whether loads, or the industrial devices, are receiving acceptable amounts of power required for specific operations.

In an embodiment of the present technology, a fault-managed power system is provided. The fault-managed power system may include transmitter circuitry and receiver circuitry coupled together via a transmission link formed using single-pair Ethernet cable. The transmitter circuitry can generate a fault-managed power based on power from a power source and transmit an unpulsed signal, including the fault-managed power, to the receiver circuitry via the transmission link. The receiver circuitry can identify an expected power consumption of one or more loads coupled to the receiver circuitry and provide an indication of the expected power consumption to the transmitter circuitry. The transmitter circuitry can detect a fault based on a comparison between the transmitted fault-managed power and the power consumption and terminate transmission of the fault-managed power in response to detecting the fault.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

While multiple embodiments are disclosed, still other embodiments of the present technology will become apparent to those skilled in the art from the following detailed description, which shows and describes illustrative embodiments of the invention. As will be realized, the technology is capable of modifications in various aspects, all without departing from the scope of the present invention. Accordingly, the drawings and detailed description are to be regarded as illustrative in nature and not restrictive.

BRIEF DESCRIPTION OF THE DRAWINGS

Many aspects of the disclosure can be better understood with reference to the following drawings. The components in the drawings are not necessarily drawn to scale. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

FIG. 4 illustrates a series of steps for detecting faults within a fault-managed power system in accordance with some embodiments of the present technology.

FIG. 5 illustrates an example computing system used in some embodiments of the present technology.

Figure 1:
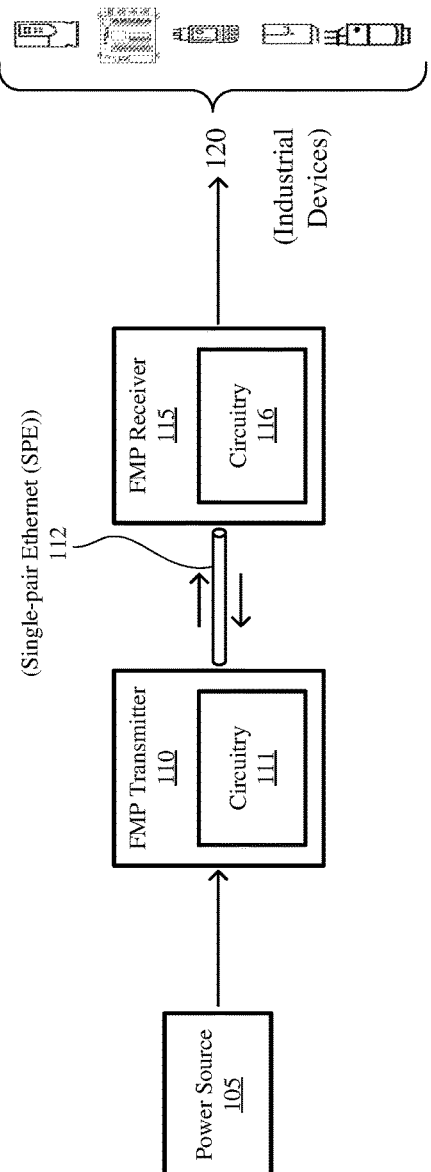
FIG. 1 illustrates an example operating environment in accordance with some embodiments of the present technology.

The drawings have not necessarily been drawn to scale. Similarly, some components or operations may not be separated into different blocks or combined into a single block for the purposes of discussion of some of the embodiments of the present technology. Moreover, while the technology is amendable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology relate to producing and transmitting fault-managed power for use in an industrial automation environment, and more particularly, to providing continuous, unpulsed power from a transmitter to a receiver using single-pair Ethernet cabling. In an industrial or commercial environment, industrial automation devices, such as variable-speed drives, motors, and the like, perform industrial automation processes and require power to perform such processes. Installation of traditional power systems requires professional installation and safety checks to ensure that AC mains electricity is properly driven to the devices and systems in an environment. Further, such cabling between AC mains electricity and systems generally requires conduit and specific installation to prevent harm to other people or equipment. Despite this safety restriction, Class 1 power does not require line-to-line fault protection to be monitored.

To address these issues, a fault-managed power system can employ a transmitter, a receiver, and low-voltage cabling, such as single-pair Ethernet (SPE) to generate fault-managed power for use by one or more loads coupled to the receiver. Fault-managed power is classified as Class 4 power under the NEC. Thus, it requires fault-detection of line-to-line faults, among other types of faults. The fault-managed power can be generated from AC mains power, or from DC power, and transmitted across the SPE continuously. The receiver can use the fault-managed power to power industrial devices in an industrial automation environment. By using SPE, conduit and other heavy-duty protection mechanisms can be avoided. Rather, SPE can be installed in cable trays and raceways along with other data cables to reduce installation costs. In addition to power being transmitted over the SPE, data and communications can be provided between the transmitter and receiver to allow the transmitter to detect various faults at speeds in accordance with safety protocols.

In an embodiment of the present technology, a fault-managed power system is provided. The fault-managed power system may include transmitter circuitry and receiver circuitry coupled together via a transmission link formed using single-pair Ethernet cable. The transmitter circuitry can generate a fault-managed power based on power from a power source and transmit an unpulsed signal, including the fault-managed power, to the receiver circuitry via the transmission link. The receiver circuitry can identify an expected power consumption of one or more loads coupled to the receiver circuitry and provide an indication of the expected power consumption to the transmitter circuitry. The transmitter circuitry can detect a fault based on a comparison between the transmitted fault-managed power and the power consumption and terminate transmission of the fault-managed power in response to detecting the fault.

In another embodiment, a method of operating a fault-managed power system is provided. The method includes, by a fault-managed power transmitter, receiving power from a power source, generating a fault-managed power based on the power, and transmitting an unpulsed signal including the fault-managed power to a fault-managed power receiver via a transmission link formed using single-pair Ethernet cable. The method further includes receiving an indication of expected power consumption from the fault-managed power receiver via the transmission link and detecting a fault based on a comparison between the transmitted fault-managed power and the expected power consumption. In response to detecting the fault, transmission of the fault-managed power may be terminated.

Optionally, in such embodiments, the receiver circuitry, receiver circuits, or FMP receivers, as in various embodiments, may measure current of one or more loads (e.g., a motor, a drive, an actuator) coupled to receive the fault-managed power and determine the power consumption based on the measured current. The transmitter circuitry, transmitter circuit, or FMP transmitter, as in various embodiments, may detect a fault based on the comparison between power dissipation within the circuitry, the transmitted FMP, and the power consumption. However, the receiver circuitry may also, or instead, perform such a comparison to detect a fault. The transmitter circuitry may be further configured to establish a data connection, such as through a continuous communication channel, with the receiver circuitry using a safety protocol over the transmission link. Information, such as the power consumption, can be provided via the data connection with a packet transmission speed in accordance with the safety protocol. The safety protocol may be a common industrial protocol or a black-channel safety protocol. Based on at the safety protocol, the transmitter circuitry may detect a fault based on a delay in receiving the indication of the power consumption from the receiver circuitry beyond a threshold time.

Advantageously, the disclosed system can provide uninterrupted, high-voltage fault-managed power while maintaining fire and shock safety. The system can use the unpulsed power signal to continuously power various industrial devices while also allowing continuous transmission of data and communications that can ride over the power transmitted over the SPE. The system can operate in accordance with one or more safety protocols, such that the transmission of data and communications can occur within threshold time frames to prevent fire, shock, or other risk if a fault is detected. Not only does the fault-managed power system improve device and system performance in an industrial automation environment, but also it can reduce installation cost and risk and increase control over power to individual devices by providing the ability to terminate transmission of the fault-managed power at the device or line level.

Turning now to the Figures, FIG. 1 illustrates an example operating environment in accordance with some embodiments of the present technology. FIG. 1 includes operating environment 100, which is representative of an environment in which industrial and commercial processes may be performed, and in which power can be converted from one form of power to fault-managed power for transmission over a transmission line for use by devices in the environment. Operating environment 100 includes power source 105, fault-managed power (FMP) transmitter 110, FMP receiver 115, and industrial devices 120. FMP transmitter 110 further includes circuitry 111, and FMP receiver 115 further includes circuitry 116. In various examples, FMP transmitter 110 and FMP receiver 115, or circuitry 111 and 116 thereof, may be configured to perform fault-managed power processes, such as process 400 of FIG. 4.

Power source 105 is representative of any alternating current (AC) or direct current (DC) power source. For example, power source 105 may be AC mains electricity or a DC source, such as a rectifier or fuel cell. In some examples, power source 105 may produce power categorized under Class 1 or Class 2 power of the NEC. Power source 105 may be coupled to FMP transmitter 110, or circuitry 111 of FMP transmitter 110, to provide power to FMP transmitter 110.

FMP transmitter 110 is representative of a device, apparatus, or circuitry capable of receiving power from power source 105, converting the power into fault-managed power, and transmitting the fault-managed power to FMP receiver 115 over a transmission link or line. To perform power conversion and transmission, FMP transmitter 110 may include circuitry 111.

Circuitry 111 is representative of various electronic and electro-mechanical elements capable of interfacing with power source 105, converting the power from power source 105 to DC power or to AC power, generating fault-managed power from the DC or AC power, and transmitting both the fault-managed power and communications to FMP receiver 115. In various examples, circuitry 111 may include a microcontroller, one or more power converters, transformers, diodes, resistors, capacitors, and the like. The microcontroller may include one or more processors or processing units capable of communicating with FMP receiver 115, transmitting data and power to FMP receiver 115, and detecting a fault within FMP transmitter 110 or FMP receiver 115 during transmission of the fault-managed power. Examples of such processor(s) may include microcontrollers, DSPs, general purpose central processing units, application specific processors or circuits (e.g., ASICs), and logic devices (e.g., FPGAs), as well as any other type of processing device, combinations, or variations thereof.

FMP transmitter 110 and FMP receiver 115 are coupled via a transmission link formed using single-pair Ethernet (SPE) 112. SPE 112, a pair of conductors (i.e., wires) may be transmitted and received over the pair of conductors. The pair of conductors may be used to transmit the fault-managed power from FMP transmitter 110 to FMP receiver 115 and exchange communications between FMP transmitter 110 to FMP receiver 115. In various examples, FMP transmitter 110 provides the fault-managed power to FMP receiver 115 over SPE 112 as an unpulsed signal. In other words, the unpulsed signal has a duty cycle of 100%, and thus, FMP transmitter 110 provides the fault-managed power constantly during operation without faults. Communications and data between FMP transmitter 110 and FMP receiver 115 can transmit directly over the fault-managed power simultaneously, allowing FMP transmitter 110 to determine whether a fault has occurred while FMP transmitter 110 sends the fault-managed power and as FMP receiver 115 receives the fault-managed power. Advantageously, FMP transmitter 110 can provide continuous power to FMP receiver 115 while also being able to identify a fault over the same transmission line.

FMP receiver 115 is representative of a device, apparatus, or circuitry capable of receiving power from FMP transmitter 110, converting the power into power consumable by industrial devices 120, and providing an expected power consumption by the industrial devices 120 to FMP transmitter 110 over SPE 112. Assuming there are no faults in the fault-managed power system, FMP receiver 115 can provide the power to industrial devices 120. To perform power conversion and transmission to industrial devices 120 and communication to FMP transmitter 110, FMP receiver 115 may include circuitry 116.

Circuitry 116 is representative of various electronic and electro-mechanical elements capable of interfacing with industrial devices 120, converting the fault-managed power to power appropriate for each of industrial devices 120, and communicating expected power consumption by industrial devices 120 to FMP transmitter 110. In various examples, circuitry 116 may include a microcontroller, one or more power converters, transformers, diodes, resistors, capacitors, and the like. The microcontroller may include one or more processors or processing units capable of communicating with FMP transmitter 110, and transmitting data to FMP transmitter 110 during transmission of the fault-managed power. Examples of such processor(s) may include microcontrollers, DSPs, general purpose central processing units, application specific processors or circuits (e.g., ASICs), and logic devices (e.g., FPGAs), as well as any other type of processing device, combinations, or variations thereof. Circuitry 111 and 116 may be referred to herein as transmitter circuitry or receiver circuitry, respectively, transmitter circuit(s) or receiver circuit(s), respectively, or the like.

Industrial devices 120 include various types of industrial and commercial devices that may be used to perform respective processes in operating environment 100. For example, industrial devices 120 may include one or more of variable-speed drives, motors, conveyer belts, circuit devices, programmable logic controllers (PLCs), relays, sensors, and more. Various components of industrial devices 120 may be coupled together via wired or wireless connections. Based on respective processes, industrial devices 120 may require different amounts of power. FMP receiver 115 may determine the amount of power required for each of industrial devices 120. The total amount of power required by industrial devices 120 may be referred to as the expected power consumption.

In operation, FMP receiver 115 determines the expected power consumption of industrial devices 120 based on the type and number of industrial devices 120, among other factors. FMP receiver 115 provides the expected power consumption to FMP transmitter 110 via SPE 112. FMP transmitter 110 performs a comparison between the fault-managed power and the expected power consumption and determines whether there is a fault based on the comparison. More specifically, FMP transmitter 110 can determine that there is a fault if the difference between the expected power consumption and the fault-managed power exceeds a threshold amount. In some cases, FMP transmitter 110 may compare the expected power consumption to the fault-managed power less other power loss in circuitry 111, such as dissipation from electrical components. If FMP transmitter 110 determines that there is a fault, FMP transmitter 110 can immediately cease transmission of the fault-managed power to FMP receiver 115, and consequently, FMP receiver 115 can stop providing power to industrial devices 120. The fault may include one or more of a line-to-line fault, a line-to-ground fault, a malfunction in FMP transmitter 110 or FMP receiver 115, over-current, short-circuit, or any other issue that could cause shock or fire to people, structures, or components of operating environment 100, among other things.

Figure 2:
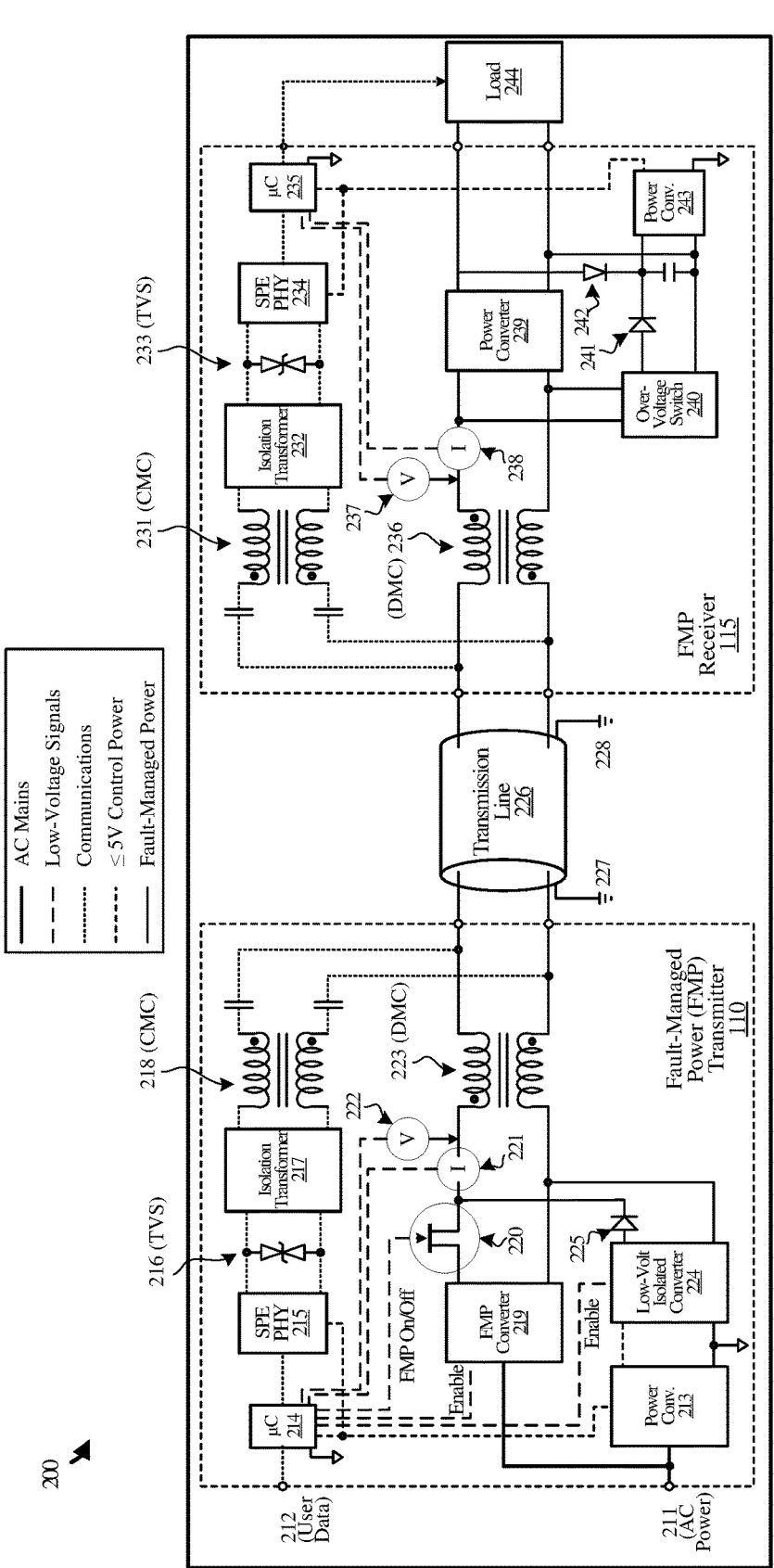
FIG. 2 illustrates an example block diagram of a fault-managed power system in accordance with some embodiments of the present technology.

FIG. 2 illustrates an example block diagram of a fault-managed power system in accordance with some embodiments of the present technology. FIG. 2 includes system 200, which includes fault-managed power (FMP) transmitter 110, transmission line 226, FMP receiver 115, and load 244. FMP transmitter 110 includes various elements, such as power converter 213, microcontroller (denoted as μC in FIG. 2) 214, single-pair Ethernet physical layer (SPE PHY) 215, transient voltage suppression (TVS) 216, isolation transformer 217, common mode choke (CMC) 218, FMP converter 219, differential mode choke (DMC) 223, and low-voltage isolated converter 224, among other elements, which may be representative of circuitry 111. FMP receiver 115 includes various elements, such as DMC 236, CMC 231, isolation transformer 232, SPE PHY 234, microcontroller 235, power converter 239, over-voltage switch 240, and power converter 243, which may be representative of circuitry 116. In various examples, FMP transmitter 110 and FMP receiver 115, and circuitry thereof, may exemplify fault-managed power components capable of performing fault-managed power processes, such as process 400 of FIG. 4.

System 200 is representative of a fault-managed power system capable of converting AC or DC power from a power source into fault-managed power to be transmitted over low-voltage cabling, as opposed to conventional electrical transmission cabling, for use downstream. More specifically, FMP transmitter 110 can obtain AC or DC power, convert the power to fault-managed power, and provide the fault-managed power to FMP receiver 115. FMP receiver 115 uses the fault-managed power to provide one or more loads (e.g., load 244) power to operate.

Fault-managed power (FMP) transmitter 110 is representative of a device, apparatus, or circuitry capable of receiving AC power 211 from a power source, converting the power into fault-managed power, and transmitting the fault-managed power to FMP receiver 115 over a transmission line 226. To perform power conversion and transmission, FMP transmitter 110 includes various circuits, devices, and other components. More particularly, FMP transmitter 110 may control the circuits, devices, and other components and operations of such elements using microcontroller 214. FMP transmitter 110 may initiate transmission of fault-managed power and communications following a start-up phase, which is described below with respect to FIG. 3.

Microcontroller 214 is representative of one or more processors or processing units capable of communicating with (i.e., via communications signals denoted by thin, dotted lines in FIG. 2) and controlling (i.e., via low-voltage signals denoted by thick, dashed lines in FIG. 2) components of FMP transmitter 110 and components of FMP receiver 115. For example, microcontroller 214 may be coupled with SPE PHY 215, FMP converter 219, power converter 213, and low-voltage isolated converter 224. Microcontroller 214 may perform one or more predetermined, or pre-programmed, operations to communicate with and control such components. Microcontroller 214 may also, or instead, receive user data 212 that may direct microcontroller 214 to perform such operations. In various examples, microcontroller 214 may also include Ethernet switching circuitry, such as a communications switch or bridge.

User data 212 may include user-defined signals that include parameters associated with other components of FMP transmitter 110, threshold values related to current and voltage of the fault-managed power, instructions for enabling or disabling transmission of the fault-managed power or components of FMP transmitter 110, and the like. User data 212 may also include data unrelated to the operations of FMP transmitter 110 and FMP receiver 115, such as data to and from load 244 (e.g., industrial devices 120) or to and from a programmable logic controller (PLC) (not shown) coupled to load 244. In an initial start-up phase of FMP transmitter 110, microcontroller 214 may disable the generation of fault-managed power so that the fault-managed power cannot be transmitted to receiver 115 until other elements are initialized. For example, microcontroller 214 may first provide internal control power (denoted by the thin, dashed line in FIG. 2) to power converter 213 so that power converter 213 can receive AC power 211 and operate to convert AC power 211 to a value usable by FMP transmitter 110.

AC power 211 includes power from AC mains, such as a power grid, or any other source capable of producing AC power (e.g., power source 105 of FIG. 1). In some examples, AC power 211 may qualify as Class 1 or Class 2 power of the NEC. In other cases, however, AC power 211 may be a different class of power, or alternatively, transmitter 110 may receive DC power instead of AC power 211. FMP transmitter 110 receives AC power 211 at power converter 213 and at FMP converter 219 (denoted by the bolded solid line in FIG. 2).

Power converter 213 is representative of an AC-to-DC or DC-to-AC power converter capable of intaking AC power 211 and converting AC power 211 to a different AC value or to DC power. In some examples, power converter 213 may output an increased power, however, in other examples, power converter 213 may output a decreased power with respect to AC power 211. Power converter 213 may output a converted power to low-voltage isolated converter 224.

Low-voltage isolated converter 224 is representative of a power converter that may be capable of converting power output by power converter 213 to a low-voltage control power. In various examples, the low-voltage control power is DC power that may be provided over transmission line 226 to FMP receiver 115 to power-on components of FMP receiver 115 like power converter 243, microcontroller 235, and other components. The low-voltage control power may pass through diode 225 to further power-on current sensor 221 and voltage sensor 222.

After microcontroller 214 initializes components, such as power converter 213 and low-voltage isolated converter 224 of FMP transmitter 110, microcontroller 214 can check voltage and current values of signals on transmission line 226, via voltage sensor 222 and current sensor 221, to determine if power converter 213 and low-voltage isolated converter 224 are producing expected values.

Current sensor 221 and voltage sensor 222 are coupled between FMP converter 219 and DMC 223 to obtain current and voltage measurements at transmission line 226, respectively. It follows that current sensor 221 and voltage sensor 222 are sensors or devices capable of reading current values and voltage values, respectively. Microcontroller 214 can read the measurements as current passes through the sensors and can detect a fault in FMP transmitter 110 or FMP receiver 115 based on the measurements read by current sensor 221 and voltage sensor 222. In various examples, low-voltage isolated converter 224 may be designed to generate a 3.3 V output. Thus, microcontroller 214 may obtain measurements from voltage sensor 222 to determine whether the output meets or is approximately equal to the expected output of 3.3 V. Similarly, microcontroller 214 may determine an expected current by dividing the voltage from low-voltage isolated converter 224 by a resistance value associated with cables used in FMP transmitter 110. In some examples, the resistance values may be pre-programmed cable resistance determined at the time of design. In other examples, microcontroller 214 may use SPE PHY 215 to measure transmission line resistance.

SPE PHY 215 is representative of a physical layer that may provide an interface between FMP transmitter 110 and FMP receiver 115. More specifically, SPE PHY 215 may interface with SPE PHY 234 of FMP receiver 115. SPE PHY 234 may also be representative of a physical layer for microcontroller 235. SPE PHYs 215 and 234 may perform negotiations and hand-shakes between each other to establish communication between microcontrollers 214 and 235. SPE PHYs 215 and 234 may also provide user data 212 between each other. SPE PHYs 215 and 234 communicate with each other via transmission line 226. Microcontroller 214, via SPE PHY 215 provides communications (denoted by the thin, dotted lines in FIG. 2) through TVS 216, isolation transformer 217, and CMC 218, which may provide filtering of data and communication signals when transmitting communications from microcontroller 214 to microcontroller 235. Similarly, microcontroller 235 receives and transmits communications, via SPE PHY 234, through TVS 233, isolation transformer 232, and CMC 231, which provide similar functionality. Microcontroller 235 may also include Ethernet switching circuitry, such as a communications switch or bridge, which may support the reception and distribution of communications between FMP receiver 115 and load 244.

In various examples, SPE PHYs 215 and 234 form a black channel over which a safety protocol, such as a black-channel safety protocol, a common industrial protocol (CIP), or another type of safety protocol, that meets packet transmission requirements and security requirements of a design may be used. If the measurements from current sensor 221 or voltage sensor 222 do not meet the expected values, microcontroller 214 can detect a fault and disable low-voltage isolated converter 224 and attempt to restart operations of power converter 213 and low-voltage isolated converter 224. If the measurements meet the expected values, SPE PHY 215 may initiate communications with FMP receiver 115 to ensure there are no faults at FMP receiver 115.

Transmission line 226 is representative of cabling used to physically couple FMP transmitter 110 and FMP receiver 115 (e.g., SPE 112). In various examples, transmission line 226 is formed using single-pair Ethernet (SPE). SPE may be transmitted and received over a pair of conductors (i.e., wires). Both conductors of the SPE may be used to transmit the fault-managed power from FMP transmitter 110 to FMP receiver 115 and to transmit data and communications simultaneously, such as user data 212, expected power consumption, and other information communicable via SPE PHYs 215 and 234. With SPE, full-duplex communications (i.e., communication in both directions) can occur as electrical signals transmitted over the conductors may be superimposed over power signals. In various examples, echo cancellation techniques may be used by FMP transmitter 110 and FMP receiver 115 so that signals leaving a respective SPE PHY do not return to the same SPE PHY's receiver circuitry. Such SPE, or transmission line 226, may further be coupled to ground nodes 227 and 228.

After low-voltage isolated converter 224 provides the low-voltage signal to FMP receiver 115, the low-voltage signal can pass through over-voltage switch 240, through diode 241, and to power converter 243. Over-voltage switch 240 is representative of a switch that allows or prevents current flow to power converter 243 based on the low-voltage signal provided by FMP transmitter 110. Similarly, over-voltage switch 240 and diode 241 may prevent current from flowing from power converter 243 to transmission line 226.

Power converter 243 is representative of a low-voltage power converter that performs DC-to-DC power conversion using the low-voltage power provided by FMP transmitter 110 and provides the converted DC power to power microcontroller 235 of FMP receiver 115, among other components of FMP receiver 115.

Microcontroller 235, like microcontroller 214 is representative of one or more processors or processing units capable of communicating with (i.e., via communications signals denoted by thin, dotted lines in FIG. 2) and controlling (i.e., via low-voltage signals denoted by thick, dashed lines in FIG. 2) components of FMP receiver 115, and further, communicating data and information to FMP transmitter 110. For example, microcontroller 235 may be coupled with SPE PHY 234, power converter 239, and load 244. Via SPE PHYs 234 and 215, microcontroller 235 may be directed to measure line voltage and current on transmission line 226 using voltage sensor 237 and current sensor 238, representative of sensors capable of measuring values of voltage and current, respectively. Microcontroller 235 can provide such measurements to microcontroller 214 via SPE PHY 234.

Microcontroller 235 can check for several conditions with respect to the measured current and voltage at FMP receiver 115. For example, microcontroller 235 can determine whether the voltage at transmission line 226 in FMP receiver 115 meets or exceeds a threshold value (e.g., 3.3 V). Microcontroller 235 can also determine whether the current at transmission line 226 in FMP receiver 115 meets or exceeds a threshold value. Further, microcontroller 235 can compare the current measured at FMP receiver 115 via current sensor 238 and the current measured at FMP transmitter 110 via current sensor 221 to determine whether the current values are equal, or approximately equal, to each other within a threshold error value. Additionally, microcontroller 235 can compare the power transmitted from FMP transmitter 110 is equal, or approximately equal, to the power received at FMP receiver 115 within a threshold error value. If microcontroller 235 determines that all of the above conditions are met, microcontroller 235 can provide an indication of success to microcontroller 214 via SPE PHYs 215 and 234. If microcontroller 235 determines that one or more of the above conditions are not met, microcontroller 235 can provide an indication of a fault to FMP transmitter 110. Upon receiving the indication of the fault, FMP transmitter 110 can disable low-voltage isolated converter 224 and repeat initialization of components of FMP transmitter 110.

In various examples, microcontroller 235 may check for such conditions for a pre-determined amount of time or for a pre-determined number of times in accordance with a safety protocol. Similarly, microcontroller 214 may employ a watchdog timer to ensure that microcontroller 235 is providing indications of success or fault within a threshold time. If microcontroller 214 determines that microcontroller 235 has not provided an indication in accordance with the threshold time, microcontroller 214 can determine that a fault has occurred, and microcontroller 214 can disable low-voltage isolated converter 224. Additionally, if microcontroller 214 determines that data has been lost on transmission from microcontroller 235 to microcontroller 214 (e.g., two or more packets in a row), microcontroller 214 can determine that a fault has occurred.

If microcontroller 214 does not detect any faults following initialization of the low-voltage signals and communication between microcontrollers 214 and 235, microcontroller 214 can direct FMP converter 219 to turn on to begin generating fault-managed power. FMP converter 219 is representative of an AC-to-DC power converter that can convert AC power 211 from the power source (denoted by the bolded, solid line in FIG. 2) to DC power of approximately 400 VDC. FMP converter 219 outputs the fault-managed power to FMP receiver 115 via transmission line 226.

Transistor 220 is coupled between FMP converter 219 and transmission line 226 and may prevent the fault-managed power from flowing to FMP receiver 115 if disabled. Microcontroller 214 is coupled to a gate of transistor 220 and can control whether the fault-managed power can flow through transistor 220 to FMP receiver 115 or not. For example, microcontroller 214 may cause transistor 220 to prevent the fault-managed power from passing through transistor 220 if microcontroller 214 detects a fault or determines that FMP receiver 115 is not yet powered-on, load 244 is not connected, or for some other reason. While transistor 220 is depicted as a single transistor, multiple transistors, or any other type of switching or gating device, may be used.

DMC 223 is also included on transmission line 226 within FMP transmitter 110. DMC 223 may be included to filter noise from the fault-managed power generated by FMP converter 219 before the fault-managed power is provided to FMP receiver 115 via transmission line 226. Similarly, DMC 236 is included on transmission line 226 within FMP receiver 115 and may filter noise from the fault-managed power before reaching power converter 239 and load 244.

In various examples, the fault-managed power generated by FMP converter 219 is provided to FMP receiver 115 as an unpulsed signal (i.e., 100% duty cycle; denoted by the thin, solid line in FIG. 2) via transmission line 226. While the fault-managed power is being transmitted to FMP receiver 115, microcontroller 235 can identify current and voltage measurements of the fault-managed power received at FMP receiver 115 via current sensor 238 and voltage sensor 237, respectively. Additionally, microcontroller 235 can identify an expected power consumption of the fault-managed power by load 244. Microcontroller 235 can provide the measurements and the expected power consumption to microcontroller 214 via SPE PHY 234 and in accordance with a safety protocol (i.e., within a pre-determined amount of time). Microcontroller 214 can check for several conditions with respect to the measured current and voltage of the fault-managed power at FMP receiver 115. For example, microcontroller 214 can determine whether the voltage at transmission line 226 in FMP receiver 115 is below a threshold value (e.g., 450 V). Microcontroller 214 can also determine whether the current at transmission line 226 in FMP receiver 115 is within a threshold range expected from FMP converter 219 based on the measurements provided to microcontroller 214. Further, microcontroller 214 can compare the current measured at FMP receiver 115 via current sensor 238 and the current measured at FMP transmitter 110 via current sensor 221 to determine whether the current values of the fault-managed power, before and after transmission, are equal, or approximately equal, to each other within a threshold error value. Microcontroller 214 may also compare whether the power transmitted from FMP transmitter 110 is equal, or approximately equal, to the power received at FMP receiver 115 within a threshold error value. Additionally, microcontroller 214 can compare the expected power consumption with the amount of fault-managed power transmitted by FMP transmitter 110. If microcontroller 214 determines that all of the above conditions are met, microcontroller 214 can provide an indication of success to microcontroller 235 via SPE PHYs 215 and 234.

In various examples, microcontroller 235 may provide measurements to microcontroller 214 according to a safety protocol with a packet interval less than or equal to a threshold packet interval (e.g., 0.5 milliseconds). For example, using one safety protocol, a set of measurements from microcontroller 235 must arrive at microcontroller 214 within a threshold time, which may be a fixed multiple of the nominal packet interval (e.g., four times a nominal 0.5 millisecond packet interval, thus within 2 milliseconds). If microcontroller 214 does not receive a fresh set of measurements from microcontroller 235 within the threshold time, microcontroller 214 can consider this a fault condition and open transistor 220, rapidly removing FMP from transmission line 226. The threshold time may be chosen such that the energy delivered by the FMP within this time interval is less than would be needed to cause human harm or ignite a fire.

Power converter 239 can receive the fault-managed power and convert the fault-managed power to a different DC power or to AC power for consumption by load 244. Power converter 239 is coupled to provide the converted fault-managed power to load 244. Load 244 is representative of one or more industrial devices used in an industrial automation environment, commercial environment, or industrial environment, such as one or more of industrial devices 120 of FIG. 1. For example, load 244 may include one or more of variable-speed drives, motors, conveyer belts, circuit devices, programmable logic controllers (PLCs), relays, sensors, and more. While load 244 is shown as a single box in FIG. 2, load 244 may include several loads (e.g., industrial devices 120), each coupled to FMP receiver 115 to receive fault-managed power.

While FMP converter 219 is enabled and transmitting the fault-managed power to FMP receiver 115, low-voltage isolated converter 224 may stay enabled, however, the low-voltage power may not transmit via transmission link 226 as diode 225, coupled between low-voltage isolated converted 224 and transmission link 226 may be reverse-biased and prevent the low-voltage power from flowing through diode 225 to transmission link 226.

If microcontroller 235 determines that one or more of the above conditions are not met, microcontroller 235 can provide an indication of a fault to FMP transmitter 110. Upon receiving the indication of the fault, FMP transmitter 110 can disable transistor 220 and/or FMP converter 219 to prevent transmission of the fault-managed power to FMP receiver 115. In FMP receiver 115, over-voltage switch 240 can prevent the fault-managed power from flowing to power converter 243 to prevent damage of power converter 243. Microcontroller 214 can wait a pre-determined amount of time or for user data 212 before beginning transmission of the fault-managed power again.

In various other examples, additional, fewer, or different components may be included in or coupled to FMP transmitter 110 and FMP receiver 115. Additionally, components thereof may be coupled or wired to each other in different manners, which may create different topologies or architectures.

Figure 3:
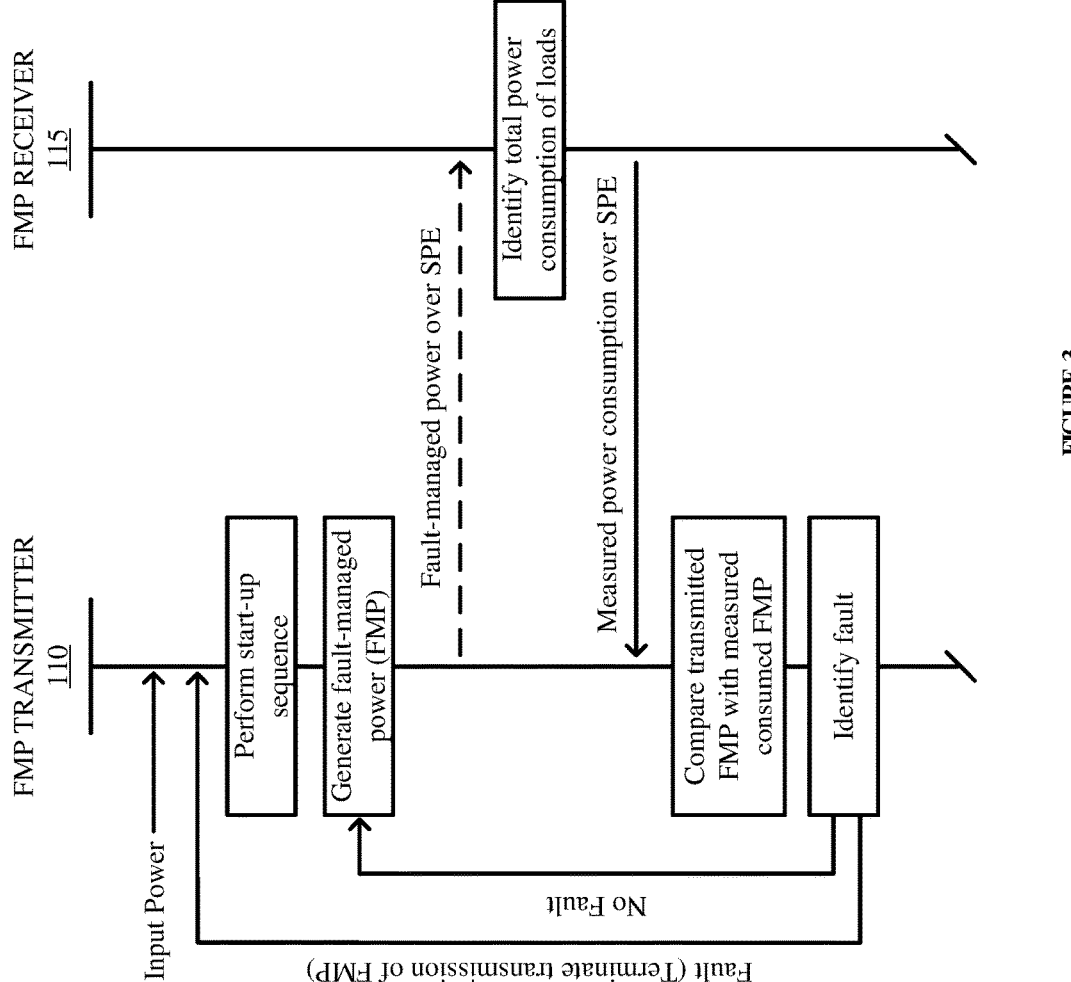
FIG. 3 illustrates an example sequence of events performable by elements of a fault-managed power system in accordance with some embodiments of the present technology.

FIG. 3 illustrates an example sequence of events performable by elements of a fault-managed power system in accordance with some embodiments of the present technology. FIG. 3 demonstrates operating environment 300, which includes FMP transmitter 110 and FMP receiver 115. In various examples, FMP transmitter 110 and FMP receiver 115 may be representative of and include components of FMP transmitter 110 and FMP receiver 115 of FIG. 1, respectively, and FMP transmitter 110 and FMP receiver 115 of FIG. 2, respectively.

FMP transmitter 110 is representative of a device, apparatus, or circuitry capable of receiving input power from a power source (not shown), converting the input power into fault-managed power, and transmitting the fault-managed power to FMP receiver 115 over a transmission link or line. The input power may be AC power, such as from AC mains, or DC power.

FMP transmitter 110 may include one or more components (e.g., circuitry 111) capable of generating fault-managed power (FMP), which can be transmitted safely over low-voltage cables as opposed to conventional commercial transmission line cabling. The FMP may differ from the input power. For example, FMP transmitter 110 may generate an FMP that is of a higher or lower voltage than the input power or of a different type (i.e., DC power).

Prior to generating FMP, FMP transmitter 110 may begin producing low-voltage DC power using the received input power. After low-voltage power is established, FMP transmitter 110 may perform a start-up sequence to initialize circuitry of FMP transmitter 110 (e.g., circuitry 111) and FMP receiver 115 (e.g., circuitry 116). The start-up sequence may begin when the input power is provided to FMP transmitter 110. A control AC-to-DC power converter (e.g., power converter 213 of FIG. 2), a low-voltage power converter (e.g., low-voltage isolated converter 224), a microcontroller of FMP transmitter 110 (e.g., microcontroller 214), and SPE PHY 215 may turn on, and an FMP AC-to-DC power converter (e.g., FMP converter 219) may be disabled. The low-voltage power converter can transmit low-voltage DC power over single-pair Ethernet cable (SPE) (e.g., SPE 112, transmission line 226) to FMP receiver 115. This low-voltage DC power may be current limited (e.g., an E-fuse) to prevent damage or harm in case there is a short circuit condition somewhere between FMP transmitter 110 and FMP receiver 115. SPE may include a single pair of conductors (i.e., wires) that connect FMP transmitter 110 to FMP receiver 115. The low-voltage power passes through an over-voltage switch (e.g., over-voltage switch 240) in FMP receiver 115 causing a control DC-to-DC converter (e.g., power converter 243) in FMP receiver 115 to turn on. Next, both a microcontroller (e.g., microcontroller 235) and SPE PHY 234 of FMP receiver 115 turn on.

After low-voltage power is flowing through both FMP transmitter 110 and FMP receiver 115, the microcontroller of FMP transmitter 110 measures the voltage and current flowing through wires of FMP transmitter 110. If the microcontroller determines that the voltage and current are above threshold values, the start-up procedure can continue. If not, the microcontroller can disable the control AC-to-DC power converter 213 and the low-voltage power converter 224 to prevent damage to either FMP transmitter 110 or FMP receiver 115. The microcontroller may wait an amount of time, then attempt to begin the start-up sequence again. If the microcontroller determines that the voltage and current are within threshold values, the microcontroller can establish a communication channel between FMP transmitter 110 and FMP receiver 115 via SPE physical layers (PHYs) (e.g., SPE PHYs 215 and 234). The communication channel may form a black channel by which FMP transmitter 110 and FMP receiver 115 can communicate in accordance with a safety protocol (e.g., CIP). At this time, the microcontroller of FMP receiver 115 can measure the line voltage and current flowing through components of FMP receiver 115 and communicate using a safety protocol these measurements to FMP transmitter 115 via the SPE. The microcontroller of FMP transmitter 110 can compare the measurements from FMP receiver 115 to threshold values and determine whether there is a fault at FMP receiver 115. If so, FMP transmitter 110 may stop transmission of the low-voltage DC power to FMP receiver 115. If not, FMP transmitter 110 can enable the FMP AC-to-DC converter to begin generating the FMP.

In various examples, FMP transmitter 110 provides the FMP over the SPE (e.g., SPE 112). Both conductors of the SPE may be used to transmit the fault-managed power from FMP transmitter 110 to FMP receiver 115 and to transmit data and communications simultaneously (e.g., user data 212 of FIG. 2), expected power consumption, and other information communicable via physical layers (e.g., SPE PHYs 215 and 234 of FIG. 2). With SPE, full-duplex communications (i.e., communication in both directions) can occur as electrical signals transmitted over the conductors may be superimposed over power signals. In various examples, echo cancellation techniques may be used by FMP transmitter 110 and FMP receiver 115 so that signals leaving a respective SPE PHY do not return to the same SPE PHY's receiver circuitry. FMP transmitter 110 may provide the FMP to FMP receiver 115 over the SPE as an unpulsed signal. In other words, the unpulsed signal has a duty cycle of 100%, and thus, FMP transmitter 110 can provide the FMP continuously until FMP transmitter 110 disables transmission of the FMP. Communications and data between transmitter 110 and FMP receiver 115 can ride over the unpulsed signal via the SPE, which may allow FMP transmitter 110 to determine whether a fault has occurred during transmission of the FMP at packet intervals in accordance with a safety protocol (e.g., CIP Safety).

In identifying faults with the FMP, FMP transmitter 110, or FMP receiver 115, FMP receiver 115 can identify expected power consumption by one or more loads coupled with FMP receiver 115 (not shown) (e.g., industrial devices 120). FMP receiver 115 can further measure voltage and current of the FMP transmitted to FMP receiver 115. FMP receiver 115 can transmit such measurements over the SPE to FMP transmitter 110. In some examples, FMP receiver 115 may transmit these measurements within a certain, pre-determined amount of time (i.e., in accordance with a watchdog timer of FMP transmitter 110) or else FMP transmitter 110 can detect a fault with FMP receiver 115.

FMP transmitter 110 can perform a comparison between the voltage and current of the FMP transmitted to FMP receiver 115, the voltage and current of the FMP received at FMP receiver 115, the power consumption of the loads, and any loss or dissipation in the transmission. In some cases, however, FMP receiver 115 may perform the comparison. If FMP transmitter 110 determines that the differences exceed threshold voltage and current values, FMP transmitter 110 can identify a fault. The fault may include one or more of a line-to-line fault, a line-to-ground fault, a malfunction in FMP transmitter 110 or FMP receiver 115, over-current, short-circuit, or any other issue that could cause shock or fire to people, structures, or components of an industrial or commercial environment, among other things. In response to identifying the fault, FMP transmitter 110 can terminate transmission of the FMP to FMP receiver 115. This may entail disabling or turning off a component capable of generating the FMP, opening one or more switches to prevent current from flowing through the SPE, or blocking the flow of the FMP from FMP transmitter 110 to FMP receiver 115 by using one or more transistors, diodes, or other electrical elements. Subsequently, FMP transmitter 110 may initiate the start-up sequence again and begin transmission of the FMP after the fault has been resolved.

If there is not a fault, however, FMP transmitter 110 can continue to generate the FMP and provide the FMP to FMP receiver 115. In some cases, this may entail generating new instances of the FMP and performing the sequence described herein repeatedly unless or until a fault is detected by FMP transmitter 110.

FIG. 4 illustrates a series of steps for detecting faults within a fault-managed power system in accordance with some embodiments of the present technology. FIG. 4 includes process 400, which references elements of operating environment 100 of FIG. 1. In various examples, process 400 may be implemented in hardware, software, firmware, or any combination or variation. For example, process 400 may be implemented in circuitry 111 of FMP transmitter 110 and/or circuitry 116 of FMP receiver 115.

In operation 405, FMP transmitter 110 receives power from power source 105. Power source 105 is representative of any alternating current (AC) or direct current (DC) power source. For example, power source 105 may be AC mains electricity or a DC source, such as a rectifier or fuel cell. In some examples, power source 105 may produce power categorized under Class 1 power of the NEC. Power source 105 may be coupled to FMP transmitter 110, or circuitry 111 of FMP transmitter 110, to provide power to FMP transmitter 110.

FMP transmitter 110 is representative of a device, apparatus, or circuitry capable of receiving power from power source 105, converting the power into fault-managed power, and transmitting the fault-managed power to FMP receiver 115 over a transmission link or line (SPE 112).

In operation 410, FMP transmitter 110 generates a fault-managed power based on the power from power source 105. FMP transmitter 110 includes circuitry 111, representative of various electronic and electro-mechanical elements capable of interfacing with power source 105, to convert the power from power source 105 to DC power or to AC power and generate fault-managed power from the DC or AC power. In various examples, circuitry 111 may include a microcontroller, one or more power converters, transformers, diodes, resistors, capacitors, and the like. The microcontroller may include one or more processors or processing units capable of communicating with FMP receiver 115, transmitting data and power to FMP receiver 115, and detecting a fault within FMP transmitter 110 or FMP receiver 115 during transmission of the fault-managed power. Examples of such processor(s) may include microcontrollers, DSPs, general purpose central processing units, application specific processors or circuits (e.g., ASICs), and logic devices (e.g., FPGAs), as well as any other type of processing device, combinations, or variations thereof.

In operation 415, FMP transmitter 110 transmits, via a transmission link formed using SPE 112, an unpulsed signal including the fault-managed power to FMP receiver 115. SPE 112 may include two or more conductors (i.e., wires). Both conductors of the SPE 112 may be used to transmit the fault-managed power from FMP transmitter 110 to FMP receiver 115 and to transmit data and communications simultaneously (e.g., user data 212 of FIG. 2), expected power consumption, and other information communicable via physical layers (e.g., SPE PHYs 215 and 234 of FIG. 2). With SPE, full-duplex communications (i.e., communication in both directions) can occur as electrical signals transmitted over the conductors may be superimposed over power signals. In various examples, echo cancellation techniques may be used by FMP transmitter 110 and FMP receiver 115 so that signals leaving a respective SPE PHY do not return to the same SPE PHY's receiver circuitry. In various examples, FMP transmitter 110 provides the fault-managed power to FMP receiver 115 over SPE 112 as an unpulsed signal. In other words, the unpulsed signal has a duty cycle of 100%, and thus, FMP transmitter 110 provides the fault-managed power constantly during operation without faults. Communications and data between FMP transmitter 110 and FMP receiver 115 can transmit directly over the fault-managed power simultaneously, allowing FMP transmitter 110 to determine whether a fault has occurred while FMP transmitter 110 sends the fault-managed power and as FMP receiver 115 receives the fault-managed power. Advantageously, FMP transmitter 110 can provide continuous power to FMP receiver 115 while also being able to identify a fault over the same transmission line.

FMP receiver 115 is representative of a device, apparatus, or circuitry capable of receiving power from FMP transmitter 110, converting the power into power consumable by industrial devices 120, and providing an expected power consumption by the industrial devices 120 to FMP transmitter 110 over SPE 112. Assuming there are no faults in the fault-managed power system, FMP receiver 115 can provide the power to industrial devices 120. Based on industrial devices 120 coupled to FMP receiver 115, FMP receiver 115 can identify an expected power consumption of industrial devices 120, or in other words, how much of the fault-managed power should be used by industrial devices 120.

To measure the amount of fault-managed power received and the amount of power to be consumed by industrial devices 120, FMP receiver 115 may include circuitry 116. Circuitry 116 is representative of various electronic and electro-mechanical elements capable of interfacing with industrial devices 120, converting the fault-managed power to power appropriate for each of industrial devices 120, and communicating expected power consumption by industrial devices 120 to FMP transmitter 110. In various examples, circuitry 116 may include a microcontroller, one or more power converters, transformers, diodes, resistors, capacitors, and the like. The microcontroller may include one or more processors or processing units capable of communicating with FMP transmitter 110 and transmitting data to FMP transmitter 110 during transmission of the fault-managed power. Examples of such processor(s) may include microcontrollers, DSPs, general purpose central processing units, application specific processors or circuits (e.g., ASICs), and logic devices (e.g., FPGAs), as well as any other type of processing device, combinations, or variations thereof.

In operation 420, FMP transmitter 110 receives an indication of power consumption from FMP receiver 115 over SPE 112. FMP transmitter 110 can compare measurements sensed by circuitry 111 of the fault-managed power with measurements sensed by circuitry 116 of FMP receiver 115. In operation 425, FMP transmitter 110 can detect a fault based on this comparison. In some examples, FMP transmitter 110 uses pre-determined threshold values in its comparison. However, in other examples, FMP transmitter 110 can dynamically determine threshold values based on fluctuations in power consumption by industrial devices 120, for instance.

Following detection of a fault, such as a line-to-line or line-to-ground fault, FMP transmitter 110, in operation 430, terminates transmission of the fault-managed power to FMP receiver 115, such that FMP receiver 115 and industrial devices 120 coupled to FMP receiver 115 no longer receive the fault-managed power until FMP transmitter 110 initiates transmission again. In some cases, FMP transmitter 110 waits a pre-determined amount of time before re-transmitting. In other cases, FMP transmitter 110 may re-transmit the fault-managed power after a user manually resets FMP transmitter 110 and/or FMP receiver 115.

FIG. 5 illustrates computing system 501 to perform fault-managed power (FMP) generation and transmission according to an implementation of the present technology. Computing system 501 is representative of any system or collection of systems with which the various operational architectures, processes, scenarios, and sequences disclosed herein for device health collection and configuration may be employed. Computing system 501 may be implemented as a single apparatus, system, or device or may be implemented in a distributed manner as multiple apparatuses, systems, or devices. Computing system 501 includes, but is not limited to, processing system 502, storage system 503, software 505, communication interface system 507, and user interface system 509 (optional). Processing system 502 is operatively coupled with storage system 503, communication interface system 507, and user interface system 509. Computing system 501 may be representative of a cloud computing device, distributed computing device, or the like.

Processing system 502 loads and executes software 505 from storage system 503. Software 505 includes and implements FMP transmission process 506, which is representative of any of the fault-managed power generation, conversion, transmission, analysis, and other processes discussed with respect to the preceding Figures. When executed by processing system 502 to provide FMP functions, software 505 directs processing system 502 to operate as described herein for at least the various processes, operational scenarios, and sequences discussed in the foregoing implementations. Computing system 501 may optionally include additional devices, features, or functionality not discussed for purposes of brevity.

Referring still to FIG. 5, processing system 502 may comprise a micro-processor and other circuitry that retrieves and executes software 505 from storage system 503. Components of processing system 502 may include safety-certified features, such as 1 out of 2 (1002) architecture. Processing system 502 may be implemented within a single processing device but may also be distributed across multiple processing devices or sub-systems that cooperate in executing program instructions. Examples of processing system 502 include general purpose central processing units, graphical processing units, application specific processors, and logic devices, as well as any other type of processing device, combinations, or variations thereof.

Storage system 503 may comprise any computer readable storage media readable by processing system 502 and capable of storing software 505. Storage system 503 may include volatile and nonvolatile, removable and non-removable media implemented in any method or technology for storage of information, such as computer readable instructions, data structures, program modules, or other data. Examples of storage media include random access memory, read only memory, magnetic disks, optical disks, optical media, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 503 may also include computer readable communication media over which at least some of software 505 may be communicated internally or externally. Storage system 503 may be implemented as a single storage device but may also be implemented across multiple storage devices or sub-systems co-located or distributed relative to each other. Storage system 503 may comprise additional elements, such as a controller, capable of communicating with processing system 502 or possibly other systems.

Software 505 (including FMP process 506) may be implemented in program instructions and among other functions may, when executed by processing system 502, direct processing system 502 to operate as described with respect to the various operational scenarios, sequences, and processes illustrated herein. For example, software 505 may include program instructions for implementing a device health metrics process as described herein.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 505 may include additional processes, programs, or components, such as operating system software, virtualization software, or other application software. Software 505 may also comprise firmware or some other form of machine-readable processing instructions executable by processing system 502.

In general, software 505 may, when loaded into processing system 502 and executed, transform a suitable apparatus, system, or device (of which computing system 501 is representative) overall from a general-purpose computing system into a special-purpose computing system customized to provide device health metrics and contextualization and instantiation thereof as described herein. Indeed, encoding software 505 on storage system 503 may transform the physical structure of storage system 503. The specific transformation of the physical structure may depend on various factors in different implementations of this description. Examples of such factors may include, but are not limited to, the technology used to implement the storage media of storage system 503 and whether the computer-storage media are characterized as primary or secondary storage, as well as other factors.

For example, if the computer readable storage media are implemented as semiconductor-based memory, software 505 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Communication interface system 507 may include communication connections and devices that allow for communication with other computing systems (not shown) over communication networks (not shown). Examples of connections and devices that together allow for inter-system communication may include network interface cards, antennas, power amplifiers, radiofrequency circuitry, transceivers, and other communication circuitry. The connections and devices may communicate over communication media to exchange communications with other computing systems or networks of systems, such as metal, glass, air, or any other suitable communication media. The aforementioned media, connections, and devices are well known and need not be discussed at length here.

Communication between computing system 501 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses and backplanes, or any other type of network, combination of networks, or variation thereof. The aforementioned communication networks and protocols are well known and need not be discussed at length here.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A fault-managed power system, comprising:
transmitter circuitry coupled to receive power from a power source and configured to:
  generate a fault-managed power based on the power from the power source;
  transmit an unpulsed signal comprising the fault-managed power to receiver circuitry via a transmission link formed using a single-pair Ethernet cable;
  receive sensed measurements from the receiver circuitry via the transmission link;
  calculate an amount of power consumed by the receiver circuitry based on the sensed measurements;
  detect a fault based on a comparison between the transmitted fault-managed power and the amount of power consumed; and
  terminate, in response to detecting the fault, transmission of the fault-managed power to the receiver circuitry; and
the receiver circuitry coupled to the transmitter circuitry via the transmission link.

2. The fault-managed power system of claim 1, wherein the receiver circuitry is configured to measure current of one or more loads coupled to receive the fault-managed power from the receiver circuitry, and wherein the transmitter circuitry is configured to calculate the amount of the fault-managed power consumed based on the measured current.

3. The fault-managed power system of claim 2, wherein the one or more loads comprise one or more of a motor and a drive.

4. The fault-managed power system of claim 1, wherein the transmitter circuitry is further configured to detect the fault based on the comparison further between power dissipation within the transmitter circuitry, the transmitted fault-managed power, and the power consumption.

5. The fault-managed power system of claim 2, wherein the transmitter circuitry is further configured to establish a continuous communication channel with the receiver circuitry via the transmission link using a safety protocol for exchanging data signals between one or more of the transmitter circuitry, the receiver circuitry, and the one or more loads.

6. The fault-managed power system of claim 5, wherein the receiver circuitry is configured to provide the sensed measurements via the transmission link with a packet transmission speed in accordance with the safety protocol.

7. The fault-managed power system of claim 5, wherein the safety protocol is one of a common industrial protocol (CIP) and a black-channel safety protocol.

8. The fault-managed power system of claim 1, wherein the transmitter circuitry is further configured to detect the fault based on a delay in receiving the indication of the power consumption from the receiver circuitry beyond a threshold time.

9. The fault-managed power system of claim 1, wherein the fault-managed power is Class 4 power.

10. The fault-managed power system of claim 1, wherein the detected fault is one of a line-to-line fault and a line-to-ground fault.

11. The fault-managed power system of claim 1, wherein the power includes alternating-current (AC) power or direct current (DC) power.

12. The fault-managed power system of claim 1, wherein to detect the fault based on the comparison, the transmitter circuitry is further configured to perform a comparison between an expected amount of power consumed and the amount of power consumed.

13. A method, comprising:

receiving, by a fault-managed power transmitter, power from a power source;

generating, by the fault-managed power transmitter, a fault-managed power based on the power from the power source;

transmitting, by the fault-managed power transmitter, via a transmission link formed using a single-pair Ethernet cable, an unpulsed signal comprising the fault-managed power to a fault-managed power receiver;

receiving, by the fault-managed power transmitter, sensed measurements from the fault-managed power receiver via the transmission link;

calculating an amount of power consumed by the fault-managed power receiver based on the sensed measurements;

detecting, by the fault-managed power transmitter, a fault based on a comparison between the transmitted fault-managed power and the amount of power consumed; and terminating, by the fault-managed power transmitter, in response to detecting the fault, transmission of the fault-managed power to the fault-managed power receiver.

14. The method of claim 13, further comprising measuring, at the receiver circuitry, current of one or more loads coupled to receive the fault-managed power from the receiver circuitry, wherein the sensed measurements include the measured current.

15. The method of claim 13, wherein detecting the fault is further based on a comparison between the transmitted fault-managed power, the power consumption, and dissipated power within transmitter circuitry configured to transmit the unpulsed signal.

16. The method of claim 13, further comprising establishing a data connection with the receiver circuitry via the transmission link using a safety protocol.

17. The method of claim 16, wherein the receiver circuitry is configured to provide the amount of power consumed via the transmission link with a packet transmission speed in accordance with the safety protocol.

18. The method of claim 16, wherein the safety protocol is one of a common industrial protocol (CIP) and a black-channel safety protocol.

19. The fault-managed power system of claim 1, wherein detecting the fault is further based on a delay in receiving the indication of the power consumption from the receiver circuitry beyond a threshold time.

20. The method of claim 13, wherein the power includes one of alternating-current (AC) power and direct current (DC) power.

* * * * *